(12) United States Patent
Mazumder

(10) Patent No.: US 6,191,472 B1
(45) Date of Patent: Feb. 20, 2001

(54) HOLE GEOMETRY OF A SEMICONDUCTOR PACKAGE SUBSTRATE

(75) Inventor: Mohiuddin M. Mazumder, Santa Clara, CA (US)

(73) Assignee: Intel Corporation, Santa Clara, CA (US)

( * ) Notice: Under 35 U.S.C. 154(b), the term of this patent shall be extended for 0 days.

(21) Appl. No.: 09/225,926

(22) Filed: Jan. 5, 1999

(51) Int. Cl.[7] ................................................. H01L 23/52
(52) U.S. Cl. ...................... 257/691; 257/723; 257/758; 257/700; 257/724; 257/683; 257/692; 361/743; 361/780
(58) Field of Search ....................... 257/723, 758, 257/700, 724, 691, 683, 692; 361/749, 780; 438/107

(56) References Cited

U.S. PATENT DOCUMENTS 5,774,340 * 6/1998 Chang et al. ..................... 361/771

OTHER PUBLICATIONS

Mohamed Bedouani, et al; Electrical Performance of Interconnects in Polymide–Copper Thin–Film Multilayers on Ceramic Substrate; 1996 IEEE; pp. 382–390.

Chung–Ping Chein, et al.; The Signal Transmission Characteristics of Embedded Microstrip Transmission Lines Over a Meshed Ground Plane in Copper/Polymide Multichip Module; 1994 IEEE; pp. 578–583.

* cited by examiner

*Primary Examiner*—Minh Loan Tran
*Assistant Examiner*—Luan Thai
(74) *Attorney, Agent, or Firm*—Blakely, Sokoloff, Taylor & Zafman LLP

(57) ABSTRACT

A semiconductor package substrate includes at least one insulative layer, at least two metal lines next to one another on a first side of the insulative layer, and a first metal layer on a second side of the insulative layer opposing the first side. An opening is formed in the first metal layer in an area between the metal lines. Two lands remain part of the first metal layer. The lands are located adjacent the opening and each land opposes a respective one of the metal lines located next to one another.

19 Claims, 4 Drawing Sheets

HOLE GEOMETRY OF A SEMICONDUCTOR PACKAGE SUBSTRATE

BACKGROUND OF THE INVENTION

1). Field of the Invention

The present invention relates generally to semiconductor packaging.

2). Discussion of Related Art

FIG. 1 of the accompanying drawings illustrates a prior art semiconductor package 10 which is in the form of a multichip module. The semiconductor package 10 includes a package substrate 12 and first and second integrated circuits, 14 and 16 respectively, mounted to the package substrate 12 by an array of bumps 18 or the like.

The package substrate 12 includes a number of insulative layers 20 with a layer of metal lines 22, a sheet metal grounding layer 24 and a sheet metal power supply layer 26 sandwiched between the respective insulative layers 20.

In order to test the semiconductor package 10 or in order to mount the integrated circuits 14 and 16 to the package substrate 12 it may be required to heat the semiconductor package 10 to a temperature sufficient for testing purposes or to a temperature sufficient to cause reflow of the material of the bumps 18. The material of the insulative layers 20 may be a material such as a polyimide which creates a gas or gasses when being heated. Severe distortion and delamination of the layers of the package substrate 12 may occur if these gasses become trapped between the layers of the package substrate. In order to provide for outgassing of these gasses a number of openings 28 are formed in the grounding and power supply layers 24 and 26. The gasses escape from between the layers of the package substrate 12 and collect within the openings 28 thereby preventing distortion or delamination of the layers of the package substrate 12.

FIG. 2 is a plan view illustrating one of the metal layers 24 or 26 and the metal lines 22A, B, C, D, E. The metal lines 22A, B, C, D, E extend parallel to one another from one side to an opposing side of the package substrate 12 parallel with the metal layer 24 or 26. The openings 28 are located within the substrate so that three of the metal lines (22A, B, and C) pass over the openings.

FIG. 3 is a view similar to FIG. 2 wherein the metal lines 22A, B, C, D, E are shown in phantom lines in a plane of the grounding layer 24.

Referring again to FIG. 1, each integrated circuit 14 and 16 includes semiconductor electrical elements, 32A, B . . . and 36A, B . . . respectively, formed therein that may be transistors, capacitors, diodes or any other electrical elements. It is assumed, for purposes of discussion, that each of the electrical elements 32A, B . . . in the first integrated circuit 14 is connected to a respective metal line 22A, B, C, D, E and that each of the electrical elements 36A, B . . . in the second integrated circuit 16 is also connected to a respective metal line 22A, B, C, D, E and that each electrical element 32A, B . . . in the first integrated circuit 14 switches a respective electrical element 36A, B . . . in the second integrated circuit 16 by transmitting a signal through a respective metal line 22A, B, C, D, E.

Each electrical element 32A, B . . . and 36A, B . . . is also connected to both the grounding layer 24 and to the power supply layer 26. When the electrical elements 36A, B . . . in the second integrated circuit 16 are switched, return currents pass through the grounding layer 24 back to the electrical elements 32A, B . . . in the first integrated circuit 14.

The switching signals from the electrical elements 32A, B . . . in the first integrated circuit 14 through the metal lines 22 A, B, C, D, E to the electrical elements 36A, B . . . in the second integrated circuit 16 are indicated by the arrows 42 in FIG. 2.

The return currents from the electrical elements 36A, B . . . in the second integrated circuit 16 to the electrical elements 32A, B . . . in the first integrated circuit 14 are indicated by the arrows 46 in FIG. 3.

At high frequencies the return currents 46 tend to follow the paths of least inductance which tend to be localized below the respective metal lines 22A, B, C, D, E. However, since the metal lines 22A, B and C pass over the openings 28, the return currents 46 corresponding to the metal lines 22A, B, and C are diverted around the openings 28.

Due to diversion of the return currents 46 a measure of interference or "crosstalk noise" occurs between some of the return currents 46 (see for example the return currents 46 corresponding to the metal lines 22B, C and D).

Crosstalk noise between the return current 46 may affect the respective switching signals 42 relative to one another. High levels of crosstalk noise may even result in the switching signals 42 being so dramatically affected that incorrect switching of the electrical elements 36A, B . . . in the second integrated circuit 16 results, and is thus undesirable.

It can also be seen from FIG. 3 that the return signals 46 which are diverted around the openings 28 follow a longer path. By following a longer path, some of the return signals 46 may be delayed relative to one another, which, in turn, may result in delay in switching of the switching signals 42 relative to one another. Delay in the switching signals 42 relatively to one another results in "clock skew" in the switching of the electrical elements 36A, B . . . in the second integrated circuit 16. For example, should two or more of the electrical elements 32A, B . . . in the first integrated circuit 14 be clocked to simultaneously switch and therefore simultaneously transmit the switching signals 42, a delay would occur in switching one of the electrical elements 36A, B . . . relatively to switching of another of the electrical elements 36A, B . . . in the second integrated circuit.

A longer return signal will generally result in an increase in inductance (L). Inductance (L) can therefore be used as a measure for comparing delay of the return signals.

Furthermore, capacitances between the metal lines 22A, B, C, D, E and the grounding and power supply layers 124 and 126 also affect delay of the return signals. A decrease in capacitance (C) of a respective metal line 22A, B, C, D, E will generally result in less delay of the return signals.

Characteristic impedance can therefore be expressed by the formula:

$$\text{Characteristic Impedance} = \sqrt{L_s/C_s} \text{ where}$$

$L_s$ is self inductance; and $C_s$ is self capacitance.

A higher characteristic impedance will generally result in more delay.

EXAMPLE 1

FIG. 4 of the accompanying drawings illustrates schematically three of the metal lines 22A, B, and C and the grounding and power supply layers 24 and 26 in cross-section on 4—4 in FIG. 1.

The metal lines 22 A, B, and C are spaced from the grounding layer 24 by a distance D1 of about 74 μm and from the power supply layer 26 by a distance D2 of about 30

μm. Each metal line 22 A, B and C is about 37 μm thick and the grounding and power supply layers 24 and 26 are each about 22 μm thick. The pitch P from metal line to metal line is about 110 μm. Each metal line is about 2 cm long and is spaced from an adjacent metal line by about 74 μm.

At 1 GHz the following characteristic impedances are calculated for the respective metal lines:

| Metal line 22A | Metal line 22B | Metal line 22C |
|---|---|---|
| 53.8 | 61.8 | 55.0 |

It can therefore be seen that, for the given set of parameters, the characteristic impedances vary by a relatively large 36%. Such a relatively large variation in characteristic impedances results in a relatively large delay between switching signals of the metal lines 22A, B and C.

In an analysis of delay performance, the voltages at ends of the outer metal lines 22A and 22C are switched from high to low (attacker input). The central metal line 22B is held low. An output voltage is measured at an opposing end of the metal lines 22A and 22C to obtain an indication of delay. FIG. 9 is a graph illustrating the attacker input voltage and the output voltage against time. The curve indicated by reference A indicates the change in the attacker voltage. The curve indicated by the reference B indicates the change in the output voltage for a package substrate having grounding or power supply layers without openings formed therein. The curve indicated by the reference C indicates the change in the output voltage for the prior art package substrate of FIG. 4. The attacker input (curve A) drops from about 1.6 V to about 0 V in about 48 ps. The output voltage for the package substrate having grounding power supply layers without openings formed therein (curve B) is delayed with respect to the attacker voltage by about 134 ps. The output voltage for the prior art substrate (curve C) is delayed with respect to the output voltage of the substrate without openings (curve B) by about 38 ps.

SUMMARY OF THE INVENTION

A semiconductor package substrate includes at least one insulative layer, at least two metal lines next to one another on a first side of the insulative layer, and a first metal layer on a second side of the insulative layer opposing the first side. An opening is formed in the first metal layer in an area between the metal lines. Two lands remain part of the first metal layer. The lands are located adjacent the opening and each land opposes a respective one of the metal lines located next to one another.

BRIEF DESCRIPTION OF THE DRAWINGS

The invention is further described with reference to the accompanying drawings wherein like reference numerals indicate like or similar components or functions and wherein.

DETAILED DESCRIPTION OF THE INVENTION

A semiconductor package and a package substrate are described. The package substrate has power supply layers and a layer of metal lines. For purposes of outgassing, openings are formed in the grounding and power supply layers. The openings are formed in areas between the metal lines located next to one another. By so locating the openings, crosstalk noise and delay of electrical signals transmitted through the metal lines are reduced.

Figure 1:
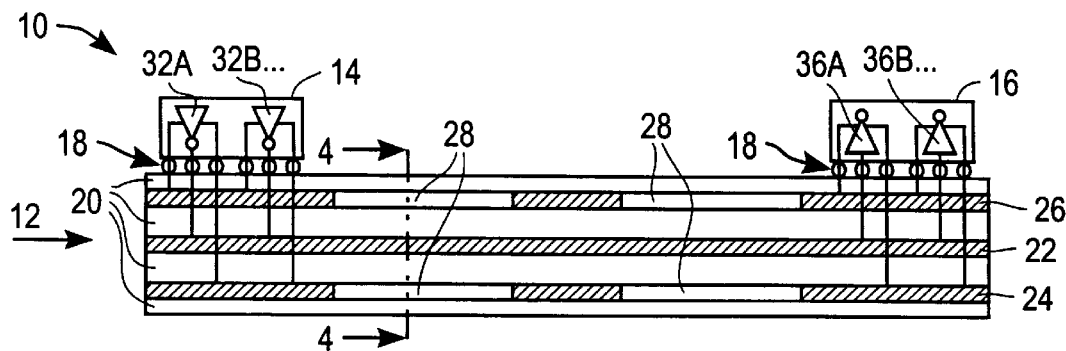
FIG. 1 is a sectioned side view of a prior art semiconductor package having a package substrate with grounding and power supply layers formed with openings therein according to a prior art geometry.
Figure 2:
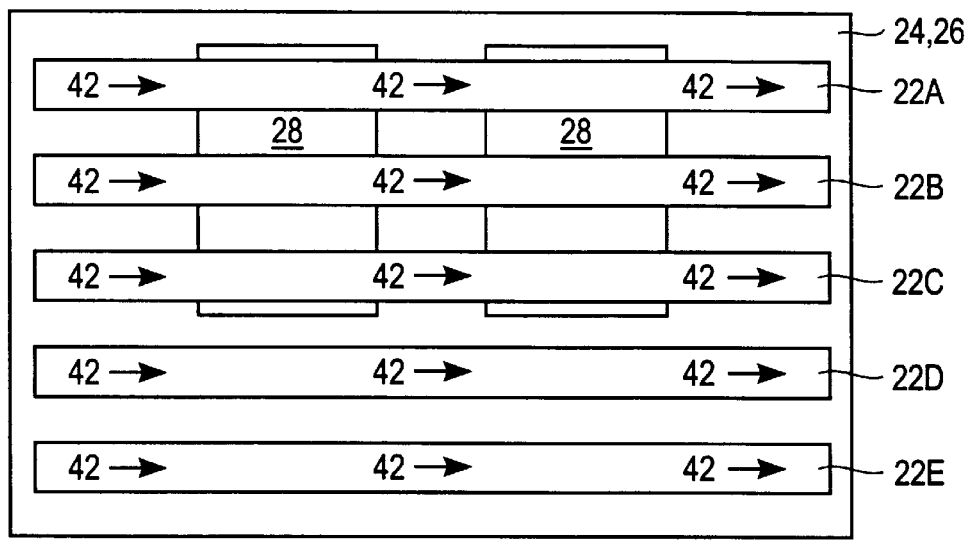
FIG. 2 is a plan view of the package substrate of FIG. 1 showing only the grounding or power supply layer and the metal lines forming part of the package substrate.
Figure 3:
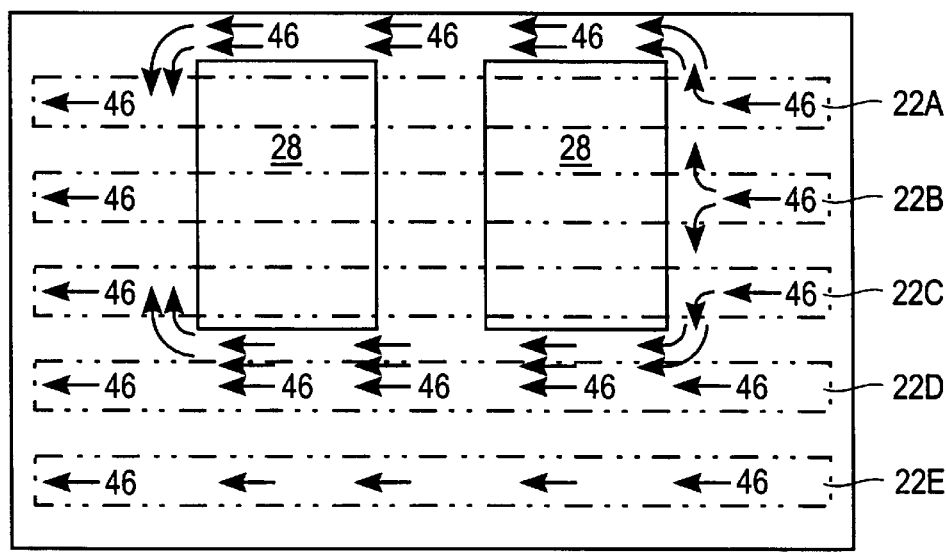
FIG. 3 is a view similar to FIG. 2 wherein the metal lines are shown in phantom lines in order to illustrate the flow of return currents in the grounding or power supply layers.
Figure 4:
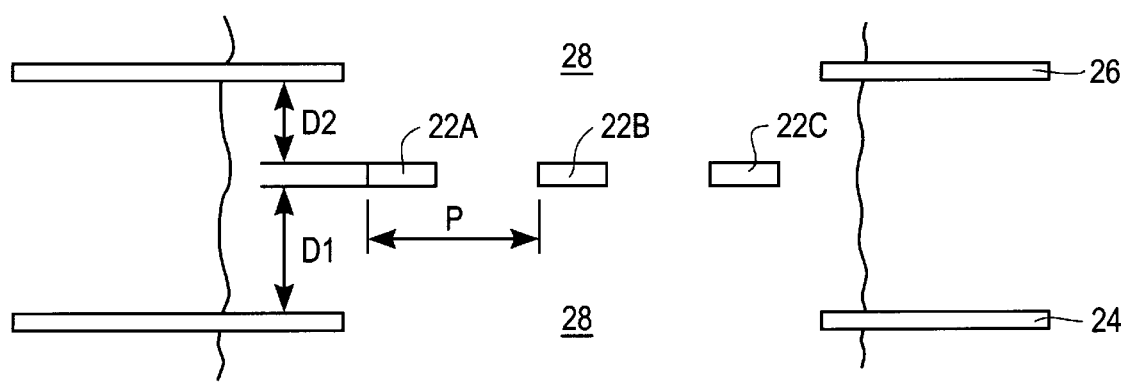
FIG. 4 is a sectioned side view on 4—4 in FIG. 1.
Figure 5:
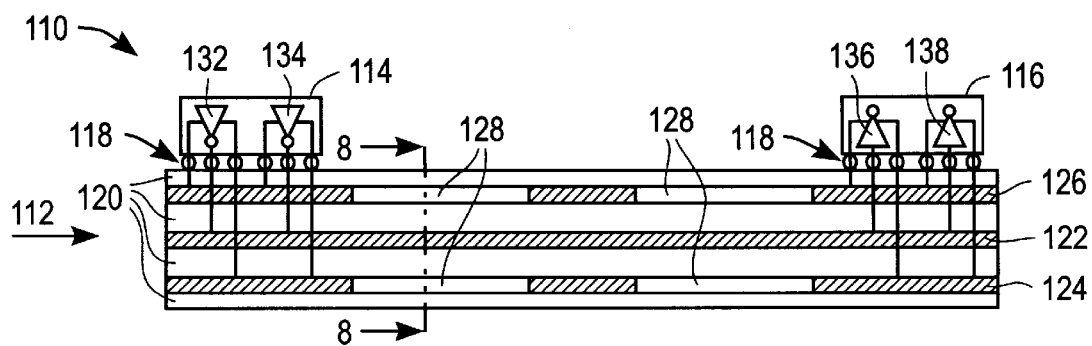
FIG. 5 is a sectioned side view of an embodiment according to the invention of a semiconductor package having a package substrate with grounding and power supply layers formed with openings.

FIG. 5 of the accompanying drawings illustrates a semiconductor package 110 according to an embodiment of the invention. The semiconductor package 110 may be in the form of a multichip module, including a package substrate 112 and first and second integrated circuits, 114 and 116 respectively, mounted to the package substrate 112.

Although only two integrated circuits (114 and 116) are shown, it should be understood that more than two integrated circuits may be mounted to the package substrate 112.

The integrated circuits 114 and 116 are mounted to the package substrate 112 by an array of bumps 118 located between the package substrate 112 and the respective integrated circuits 114. The bumps 118 may be formed according to a process known in the art as controlled collapse chip connect (C4). Although, in the present embodiment, the integrated circuits 114 and 116 are mounted to the package substrate 112 by an array of bumps, it should be understood that the integrated circuits 114 and 116 may be mounted to the package substrate 112 by alternative means such as tape automated bonding (TAB) tape or wirebonding.

The package substrate 112 includes a number of insulative layers 120 with a layer of metal lines 122A, B, C, D, E, a sheet metal grounding layer 124 and a sheet metal power supply layer 126 sandwiched between the respective insulative layers 120. For purposes of further explanation and discussion of the invention only one layer of metal lines (122A, B, C, D, E) is shown in FIG. 5. It should however be understood that the package substrate 112 may have more than one layer of metal lines.

Furthermore, in order to provide an example of physical characteristics of a package substrate, the layer of metal lines 122A, B, C, D, E of FIG. 5 is located between the grounding layer 124 and the power supply layer 126. It should be understood that the invention is not limited to a single layer of metal lines located between a grounding layer and a power supply layer. The invention may therefore also find application in a package substrate where one or more layers of metal lines are not located between a grounding layer and a power supply layer.

In order to test the semiconductor package 110 or in order to mount the integrated circuits 114 and 116 to the package substrate 112 it may be required to heat the semiconductor package 110 to a temperature sufficient for testing purposes or to a temperature sufficient to cause reflow of the material of the bumps 118. The material of the insulative layers 120 may be a material such as a polyimide which creates a gas or gasses when being heated. Severe distortion and delamination of the layers of the package substrate 112 may occur if these gasses become trapped between the layers of the package substrate. In order to provide for outgassing of these gasses a number of openings 128 are formed in the grounding and power supply layers 124 and 126. The gasses escape from between the layers of the package substrate 112 and collect within the openings 128, thereby preventing distortion and delamination of the layers of the package substrate 112. The openings are located between the first and second integrated circuits 114 and 116 in the package substrate 112. As will be discussed hereinbelow, the present invention deals with the positioning and shapes of the openings 128 in order to ensure better electrical performance of the integrated circuits 114 and 116 with respect to one another without reducing the areas of the openings 128 and so still ensuring sufficient outgassing. Although the invention has particular application in a multichip module as shown in FIG. 5, it should be understood that the invention may find application in any other electrical device having a substrate with a layer of metal lines interconnecting different electrical components and a grounding or power supply layer near the layer of metal lines.

Figure 6:
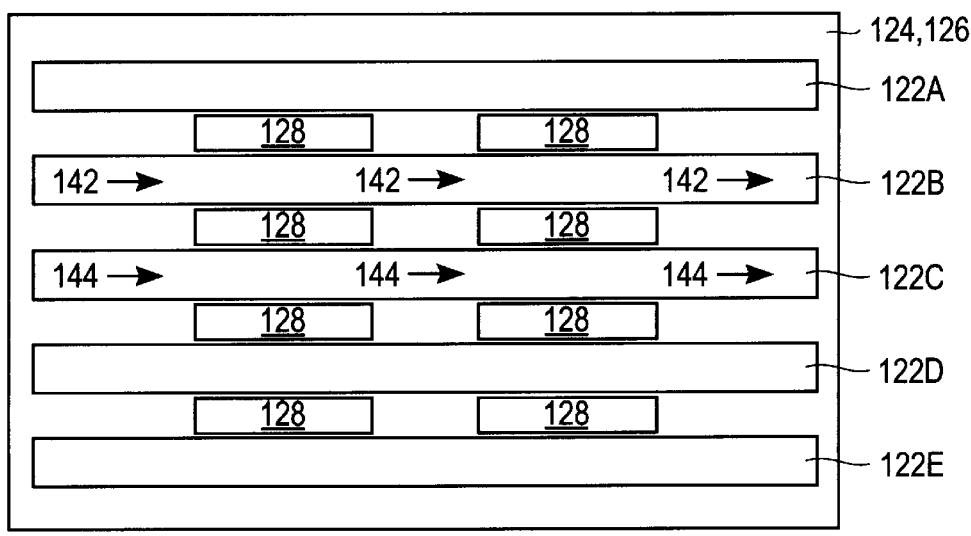
FIG. 6 is a plan view of the package substrate of FIG. 5 showing only the grounding or power supply layer and the metal lines forming part of the package substrate.

FIG. 6 is a plan view illustrating one of the metal layers 124 or 126 and the metal lines 122A, B, C, D, E. The metal lines 122A, B, C, D, E extend parallel to one another from one side to an opposing side of the package substrate 112 over the metal layer 124 or 126. Two of the openings 128 in the metal layers 124 or 126 are formed consecutively between two of the metal lines (e.g. between the metal lines 122A and 122B or between the metal lines 122B and 122C) which are located consecutively directly next to one another.

Figure 7:
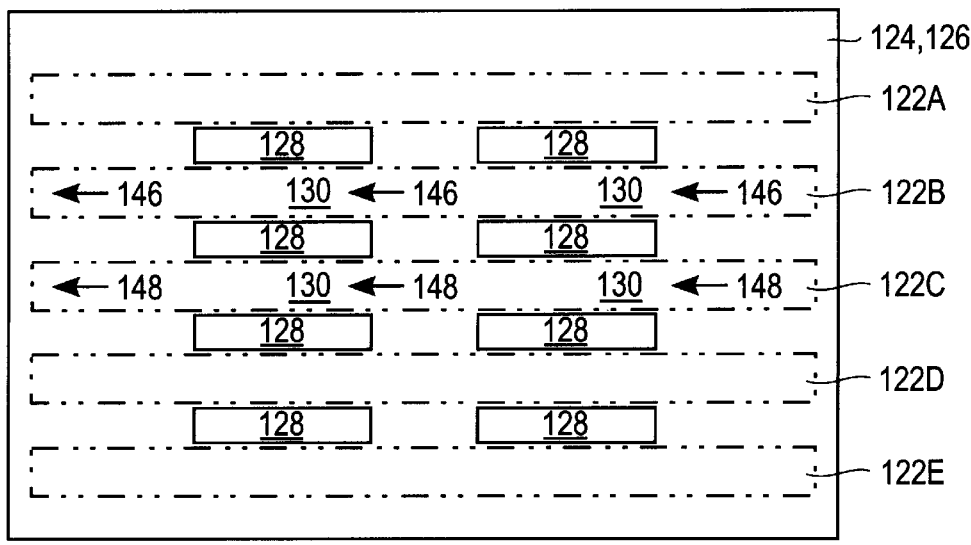
FIG. 7 is a view similar to FIG. 6 wherein the metal lines are shown in phantom lines in order to illustrate the flow of return currents in the grounding or power supply layers.

FIG. 7 is a view similar to FIG. 6 wherein the metal lines 122A, B, C, D, E are shown in phantom lines. It can be seen that, after the openings 128 are formed, a land 130 remains between adjacent openings in an area directly below or opposing each respective metal line 122. Each opening 128 has a rectangular shape which is elongate in a direction of the metal lines 122. Such an elongate shape is positionable between two metal lines located next to one another but is still large enough to ensure sufficient outgassing.

Referring again to FIG. 5, each integrated circuit 114 and 116 has a respective circuit of semiconductor electrical elements formed therein. The circuits of the integrated circuits 114 and 116 are connected to one another by the metal lines 122A, B, C, D, E. For purposes of discussion and explanation, the integrated circuit 114 is shown as having a first electrical element 132 and a second electrical element 134, and the second integrated circuit as having a third electrical element 136 and a fourth electrical element 138. The electrical elements 132, 134, 136 and 138 may be transistors, capacitors, diodes or any other semiconductor electrical elements. It is assumed that both the first and third electrical elements 132 and 138 are connected to one metal line, e.g. the metal line 122B, and the second and fourth electrical elements 134 and 138 are connected to another metal line, e.g. the metal line 122C next to the metal line 122B. The assumption is further made that the first electrical element 132 switches the third electrical element 136 by transmitting a signal through the metal line 122B and that the second electrical element 134 switches the fourth electrical element 138 by transmitting a signal through the metal line 122C.

Each electrical element 132, 134, 136 and 138 is also connected to both the grounding layer 124 and to the power supply layer 126. When the third and fourth electrical elements 136 and 138 are switched, return currents pass through the grounding layer 124 back to the first and second electrical elements 132 and 134. It is important that the return currents pass between the holes 38 in a manner which ensures correct switching of the third and fourth electrical elements 136 and 138.

The switching signals from the first and second electrical elements 132 and 134 through the metal lines 122B and 122C to respectively the third and fourth electrical elements 136 and 138 are indicated respectively by the arrows 142 and 144 in FIG. 6.

The return currents from the third and fourth electrical elements 136 and 138 through the metal layers 124 and 126 to respectively the first and second electrical elements 132 and 134 are indicated respectively by the arrows 146 and 148 in FIG. 7.

At high frequencies the return currents 146 and 148 tend to follow the path of minimum inductance which tend to be localized below the respective metal lines 122B and 122C. Since the openings 128 are formed between the metal lines, the return currents 146 and 148 pass through the lands 130, thereby, remaining under the metal lines 122B and 122C respectively.

As can be seen in FIG. 7 the return currents 146 and 148 pass separately from one another. Interference or "crosstalk noise" between the return currents 146 and 148 is so minimized. By minimizing crosstalk noise between the return currents 146 and 148, the respective switching signals 142 and 144 remain substantially unaffected, resulting in correct switching of the third and fourth electrical elements 136 and 138.

It can also be seen from FIG. 7 that, by passing through the lands 130, neither return current 146 or 148 is diverted around the openings 128 which may cause delay of one return current 146 or 148 relatively to the other. By reducing delay of one return current 146 or 148 relatively to the other, delay of one of the switching signals 142 or 144 is also reduced relatively to the other switching signal. Since delay of the switching signals 142 and 144 relative to one another is reduced, "clock skew" in switching of the third and fourth electrical elements 136 and 138 by the first and second electrical elements 132 and 134 is reduced. For example, should the first and second electrical elements 132 and 134 be clocked to simultaneously switch and therefore simultaneously transmit the switching signals 142 and 144, reduced delay of switching of the third and fourth electrical elements 136 and 138 relative to one another will occur due to the reduction in clock skew.

EXAMPLE 2

Figure 8:
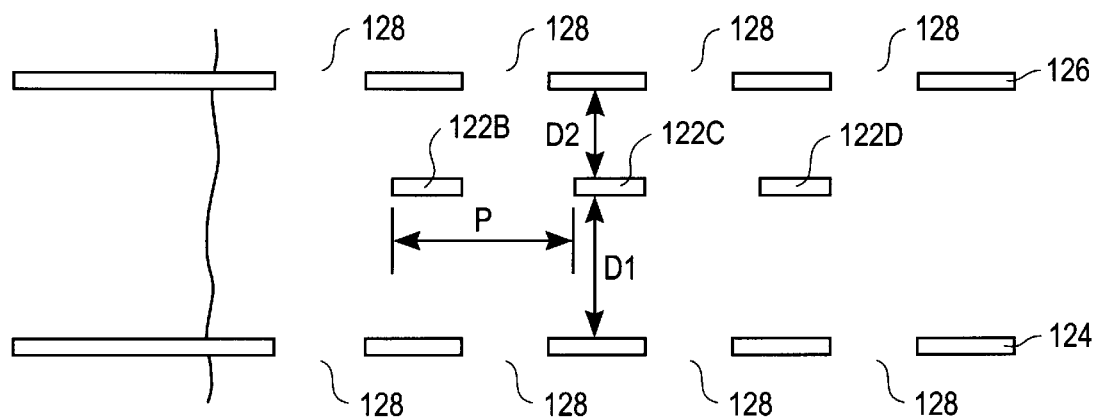
FIG. 8 is a sectioned side view on 8—8 in FIG. 5.

FIG. 8 of the accompanying drawings illustrates schematically three of the metal lines 122B, C and D and the grounding and power supply layers 124 and 126 in cross-section on 8—8 in FIG. 5.

The metal lines 122B, C and D are spaced from the grounding layer 124 by a distance D1 of about 74 $\mu$m and from the power supply layer 126 by a distance D2 of about 30 $\mu$m. Each metal line 122B, C and D is about 37 $\mu$m thick and the grounding and power supply layers 124 and 126 are each about 22 $\mu$m thick. The pitch P from metal line to metal line is about 110 μm. Each metal line is about 2 cm long and is spaced from an adjacent metal line by about 74 μm.

At 1 GHz the following characteristic impedances are calculated for the respective metal lines:

| Metal line 122B | Metal line 122C | Metal line 122D |
|---|---|---|
| 49.2 | 49.0 | 49.2 |

It can therefore be seen that, for otherwise similar conditions, the characteristic impedances of the metal lines 122B, C and D vary less for the geometry of the openings 128 in FIG. 6. There will therefore be less delay between switching signals, relatively to one another, which are transmitted through the metal lines 122B, C and D. In particular, for the given set of parameters, the characteristic impedances of the metal lines 122B, C and D vary by less than 6% relatively to one another.

Figure 9:
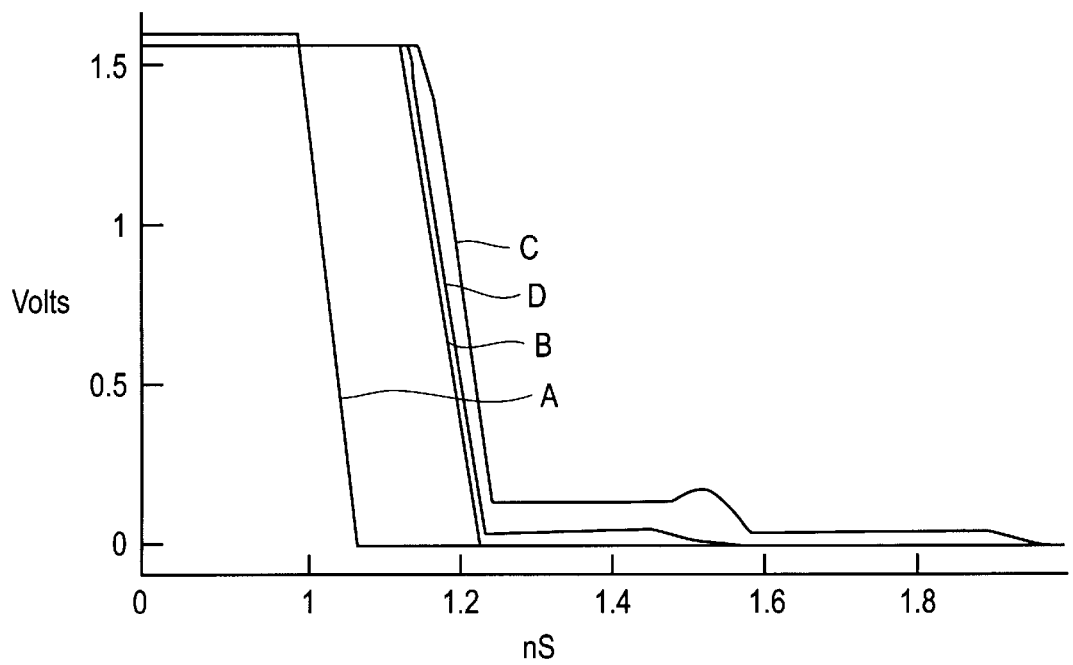
FIG. 9 is a graph comparing simulation results of delay in the prior art package substrate of FIG. 4 and the package substrate according to the invention of FIG. 8, respectively.

In an analysis of delay performance, the voltages at the ends of the outer metal lines 122B and 122D are switched from high to low (attacker input). The central metal line 122C is held low. An output voltage is measured at an opposing end of the metal lines 122B and 122D to obtain an indication of delay. FIG. 9 is a graph illustrating the attacker input voltage and the output voltage against time. The curve indicated by the reference A indicates the change in the attacker voltage. The curve indicated by the reference B indicates the change in the output voltage for a package substrate having grounding or power supply layers without openings formed therein. The curve D indicates the output voltage for a substrate according to the invention as in FIG. 8. The attacker input (curve A) drops from about 1.6V to about 0V in about 48 ps. The output voltage for the package substrate having grounding or power supply layers without openings formed therein (curve B) is delayed with respect to the attacker voltage by about 134 ps. The output voltage for the substrate according to the invention (curve D) is delayed with respect to the output voltage of the substrate without openings (curve D) by only about 10 ps. Significantly less delay therefore occurs in the substrate according to the invention (curve D) when compared with the prior art substrate (curve C).

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed:

1. A semiconductor package substrate comprising:
   at least a first insulative layer;
   at least two metal lines located next to one another in a first plane on one side of the insulative layer;
   a first metal layer, in a second plane substantially parallel to and spaced from the first plane, on a side of the insulative layer opposing the metal lines, the first metal layer having at least one opening, being entirely bounded by the first metal layer, formed therein in an area between the metal lines while leaving two respective lands adjacent the opening, each land opposing a respective one of the metal lines located next to one another so as to ensure that a signal in a respective line travels in a path substantially parallel to a signal in a respective land; and
   at least a second insulative layer on a side of the first metal layer opposing the first insulative layer and covering the opening, the opening providing space for outgassing from at least one of the insulative layers into the opening.

2. A semiconductor package substrate of claim 1 wherein at least two of the openings are formed between the metal lines, each opening being entirely bounded by the first metal layer.

3. A semiconductor package substrate of claim 1 comprising a plurality of metal lines, wherein the metal layer has a plurality of openings, each opening being formed in a respective area between two of the metal lines which are next to one another, each opening being entirely bounded by the first metal layer.

4. A semiconductor package substrate of claim 1 wherein the opening is elongate in a direction of the metal lines.

5. A semiconductor package substrate of claim 1 further comprising a second metal layer, in a third plane substantially parallel and spaced from the first plane and substantially parallel and spaced from the second plane so that the first, second and third planes are substantially parallel and spaced from one another, having at least one opening formed therethrough in an area between the metal lines, the opening in the second metal layer being entirely bounded by the second metal layer.

6. A semiconductor package substrate of claim 5 wherein the second metal layer is located on a side of the metal lines opposing the first metal layer.

7. A semiconductor package comprising:
   a package substrate having at least a first insulative layer, at least two metal lines located next to one another in a first plane on one side of the insulative layer, a first metal layer, in a second plane substantially parallel to and spaced from the first plane, on a side of the insulative layer opposing the metal lines, the first metal layer having at least one opening, being entirely bounded by the first metal layers, formed therein in an area between the metal lines while leaving two respective lands adjacent the opening, each land opposing a respective one of the metal lines located next to one another so as to ensure that a signal in a respective line travels in a path substantially parallel to a signal in a respective land, and at least a second insulative layer on a side of the first metal layer opposing the first insulative layer and covering the opening, the opening providing space for outgassing from at least one of the insulative layers into the opening; and
   a first integrated circuit mounted on the substrate and electrically connected to the metal lines and the first metal layer.

8. A semiconductor package of claim 7 wherein at least two of the openings are formed between the metal lines, each opening being entirely bounded by the first metal layer.

9. A semiconductor package of claim 7 comprising a plurality of metal lines wherein the metal layer has a plurality of openings, each opening being formed in a respective area between two of the metal lines which are next to one another, each opening being entirely bounded by the first metal layer.

10. A semiconductor package of claim 7 further comprising a second metal layer, in a third plane substantially parallel and spaced from the first plane and substantially parallel and spaced from the second plane so that the first, second and third planes are substantially parallel and spaced from one another, having at least one opening formed therethrough in an area between the metal lines, the opening in the second metal layer being entirely bounded by the second metal layer.

11. A semiconductor package of claim 10 wherein the second metal layer is located on a side of the metal lines opposing the first metal layer.

12. A semiconductor package of claim 10 wherein the opening in the second metal layer is aligned with the opening in the first metal layer.

13. A semiconductor package of claim 7 wherein the first integrated circuit comprises a first electrical element which is connected to a first of the metal lines and to the metal layer, and a second electrical element which is connected to a second of the metal lines and to the metal layer.

14. A semiconductor package of claim 13 wherein the metal layer is selected from the group consisting of a grounding layer and a power supply layer.

15. A semiconductor package of claim 7 further comprising a second integrated circuit mounted on the substrate and electrically connected to the metal lines and the metal layer.

16. A semiconductor package of claim 15 wherein the first integrated circuit comprises a first electrical element which is connected to a first of the metal lines and to the metal layer, and a second electrical element which is connected to a second of the metal lines and to the metal layer, and the second integrated circuit comprises a third electrical element which is connected to the first metal line and to the metal layer, and a fourth electrical element which is connected to the second metal line and to the metal layer.

17. A semiconductor package of claim 16 wherein the first electrical element switches the third electrical element and the second electrical element switches the fourth electrical element.

18. A semiconductor package of claim 15 wherein the opening is located between the first integrated circuit and the second integrated circuit.

19. A semiconductor package comprising:

a package substrate having an insulative layer, at least two metal lines located next to one another on a first side of the insulative layer, and a first metal layer on a second side of the insulative layer opposing the first side, the first metal layer having at least one opening, completely bounded by the first metal layer, formed therein in an area between the metal lines while leaving two respective lands adjacent the opening, each land opposing a respective one of the metal lines located next to one another;

a first integrated circuit mounted to the substrate and electrically connected to the metal lines and the first metal layer, the first integrated circuit comprising a first electrical element which is connected to a first of the metal lines and to the metal layer, and a second electrical element which is connected to a second of the metal lines and to the metal layer; and a second integrated circuit mounted to the substrate and electrically connected to the metal lines and the metal layer, the second integrated circuit comprising a third electrical element which is connected to the first metal line and to the metal layer, and a fourth electrical element which is connected to the second metal line and the metal layer, the first electrical element switching the third electrical element and the second electrical element switching the fourth electrical element, the opening being located between the first integrated circuit and the second integrated circuit.

* * * * *